US007027296B2

(12) United States Patent
Bock

(10) Patent No.: US 7,027,296 B2

(45) Date of Patent: Apr. 11, 2006

(54) PROGRAMMABLE CONTROLLER WITH EXTERNAL TERMINALS

(75) Inventor: Günther Bock, Kuemmersbruck (DE)

(73) Assignee: Siemens Aktiengesellschaft, Munich (DE)

( * ) Notice: Subject to any disclaimer, the term of this patent is extended or adjusted under 35 U.S.C. 154(b) by 215 days.

(21) Appl. No.: 10/451,524

(22) PCT Filed: Oct. 16, 2002

(86) PCT No.: PCT/DE02/03919

§ 371 (c)(1),
(2), (4) Date: Jun. 24, 2003

(87) PCT Pub. No.: WO03/039221

PCT Pub. Date: May 8, 2003

(65) Prior Publication Data

US 2004/0042164 A1 Mar. 4, 2004

(30) Foreign Application Priority Data

Oct. 24, 2001 (DE) ................................ 101 52 348

(51) Int. Cl.
*G06F 1/16* (2006.01)

(52) U.S. Cl. ...................................................... 361/683

(58) Field of Classification Search ......... 361/683–686
See application file for complete search history.

(56) References Cited

U.S. PATENT DOCUMENTS

| | | | | |
|---|---|---|---|---|
| 4,920,453 | A * | 4/1990 | Onose et al. | 361/736 |
| 5,541,810 | A | 7/1996 | Donhauser et al. | |
| 6,127,748 | A * | 10/2000 | Girard et al. | 307/139 |
| 6,172,875 | B1 * | 1/2001 | Suzuki et al. | 361/729 |
| 6,307,153 | B1 * | 10/2001 | Imoto | 174/50 |
| 6,372,154 | B1 * | 4/2002 | Li | 252/301.16 |
| 6,686,672 | B1 * | 2/2004 | Brown et al. | 307/125 |
| 2003/0108733 | A1 * | 6/2003 | Bossert | 428/323 |

FOREIGN PATENT DOCUMENTS

| | | |
|---|---|---|
| DE | 32434132 | 5/1984 |
| GB | 2223884 | 4/1990 |

* cited by examiner

*Primary Examiner*—Lisa Lea-Edmonds
(74) *Attorney, Agent, or Firm*—Staas & Halsey LLP

(57) ABSTRACT

A programmable controller with external terminals is provided, in which an electrically activatable labeling field is provided for labeling the external terminals.

11 Claims, 1 Drawing Sheet

PROGRAMMABLE CONTROLLER WITH EXTERNAL TERMINALS

CROSS REFERENCE TO RELATED APPLICATIONS

This application is based on and hereby claims priority to German Application No. 10152348.3 filed on Oct. 24, 2001, the contents of which are hereby incorporated by reference.

BACKGROUND OF THE INVENTION

A programmable controller of the type to which the present invention is directed is known, for example, from DE 36 03 750 or from EP 0 162 373 or, for example, as a programmable controller with the designation Simatic S7-300 or Simatic S7-400 from Siemens AG.

The term programmable controller refers both to a complete device and to individual modules, as they are known, or assemblies, which can be combined to form a complete device.

The programmable controllers of DE 36 03 750 have on a front side, visible to a user or operator, a number of labeling fields. Each labeling field is assigned to an external terminal, so that the user or operator is informed by the label entered in the labeling field about the functionality of the respective external terminal. The label is entered in the labeling field by hand.

The entering of a label in a labeling field is prone to error in a disadvantageous way, because it cannot be ensured that the labeling field assigned to an external terminal is correctly labeled. Moreover, completing a labeling field by hand is labor-intensive.

SUMMARY OF THE INVENTION

The invention is therefore based on the object of providing a programmable controller in which these disadvantages are avoided.

This object is achieved according to the invention by providing a programmable controller with external terminals and a front side, each external terminal being assigned a labeling field in particular on the front side, and each labeling field being an electrically activatable labeling field.

The advantage of the invention is that, with a programmable controller of this type, inconsistencies between planning of a process signal, the representation in the labeling field and the actual wiring can be avoided. The consistency of the representation in the labeling field consequently ensured with the planning/programming also makes the wiring of the programmable controller easier.

It is generally customary that, when programming a programmable controller or when planning an automation project, signal names which make it easier for such project plans or programs of this type to be read, and consequently maintained, are allocated for the individual signals from or to the external technical process. A signal which is supplied by a limit switch positioned at one end of a track is correspondingly labeled, for example, as "limit switch track end". A signal which is supplied by a filling level gage in a silo is correspondingly labeled, for example, as "silo full". These signals pass via corresponding wiring into the programmable controller at the external terminals. It is consequently desirable to provide the signal and the line over which the signal is transmitted, or the external terminal on which the line is placed, with the same label.

In the past, this label was entered in corresponding labeling fields by hand. If the labeling field is an electrically activatable labeling field, the respective label for each labeling field can be prescribed in an electrical way and obtained for this purpose in particular on the basis of data which are already available in any case after the programming of the programmable controller or after the planning of the automation project.

If the external terminals are also led to the front side where the labeling field(s) are located, a clearly evident assignment of an external terminal to the respective labeling field is possible.

If each labeling field is an alphanumeric labeling field, signal labels can be represented in plain text in the same form as they are also shown in documentation.

If each labeling field is a dot-matrix field, there is an extended possibility for representation, so that, for example, special symbols can also be represented or that, for instance, each time a change in the status of the respective signal occurs the representation of the label is inverted. When a signal is present, the label could be displayed with bright script on a dark background and, when a signal is not present, the label could be displayed with dark script on a bright background. It goes without saying that colors can also be meaningfully used here if the labeling field has color capability. Altogether, this opens up the possibility of being able to dispense with light-emitting diodes, which today often display the signal status.

Finally, each labeling field is advantageously realized by OLED technology.

According to an exemplary embodiment of the invention, the paper strip of the cited programmable controllers S7-300 or S7-400 is replaced by an electronic display.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
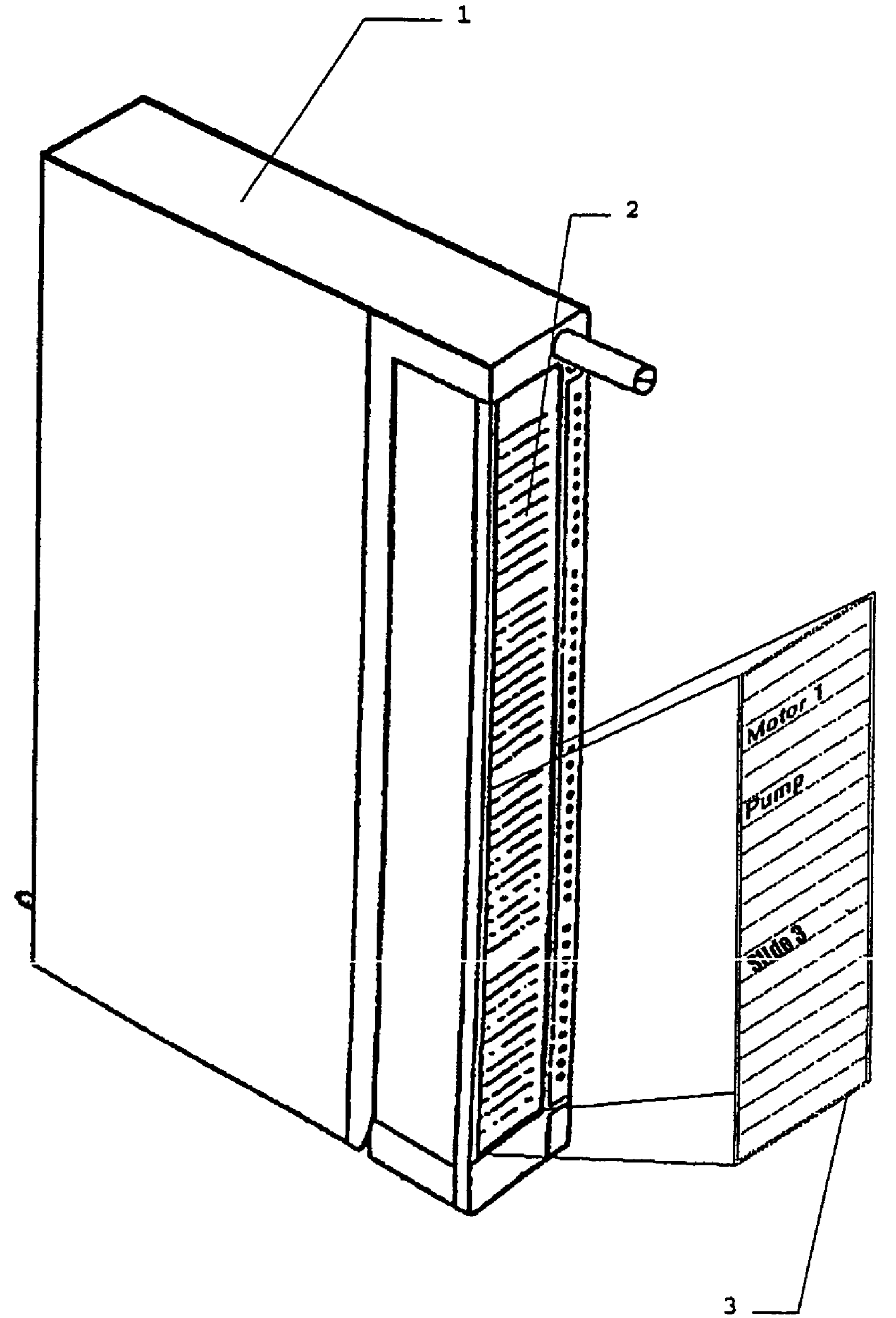
FIG. 1 shows a programmable controller with an electrically activatable labeling field

Reference will now be made in detail to the preferred embodiments of the present invention, examples of which are illustrated in the accompanying drawings, wherein like reference numerals refer to like elements throughout.

FIG. 1 shows a programmable controller 1, similar to what is described for example in EP 0 162 373. The known programmable controller has on a front side 2 with a labeling field. In such a labeling field, which for example comprises a paper strip, in the past entries have been made manually to label the various external terminals of the programmable controller 1.

According to the invention, it is envisaged to replace the previous labeling field with an electrically activatable labeling field 3. The electrically activatable labeling field 3 offers the possibility of respectively representing groups of alphanumeric characters in a number of rows, a row of the electrically activatable labeling field 3 being respectively assigned to an external terminal of the programmable controller 1. With, for example, 32 external terminals of the programmable controller, the electrically activatable labeling field 3 correspondingly comprises 32 rows, or two electrically activatable labeling fields 3 each with 16 rows or four electrically activatable labeling fields 3 each with 8 rows are provided.

Consequently, the invention can be briefly presented as follows: a programmable controller with external terminals is provided, in which an electrically activatable labeling field is provided for labeling the external terminals.

The invention has been described in detail with particular reference to preferred embodiments thereof and examples, but it will be understood that variations and modifications can be effected within the spirit and scope of the invention.

The invention claimed is:

1. A programmable controller with external terminals and a front side, comprising:

at least one electrically activatable labeling field on the front side of said programmable controller, each electrically activatable labeling field assigned to one of the external terminals.

2. The programmable controller as claimed in claim 1, wherein the external terminals are disposed on the front side of the programmable controller.

3. The programmable controller as claimed in claim 2, wherein said at least one labeling field is an alphanumeric labeling field.

4. The programmable controller as claimed in claim 3, wherein said at least one labeling field is a dot-matrix field.

5. The programmable controller as claimed in claim 4, wherein said at least one labeling field is formed of OLED technology.

6. The programmable controller as claimed in claim 3, wherein said at least one labeling field is formed of OLED technology.

7. The programmable controller as claimed in claim 2, wherein said at least one labeling field is a dot-matrix field.

8. The programmable controller as claimed in claim 2, wherein said at least one labeling field is formed of OLED technology.

9. The programmable controller as claimed in claim 1, wherein said at least one labeling field is an alphanumeric labeling field.

10. The programmable controller as claimed in claim 1, wherein said at least one labeling field is a dot-matrix field.

11. The programmable controller as claimed in claim 1, wherein said at least one labeling field is formed of OLED technology.

* * * * *